United States Patent
Tong et al.

(10) Patent No.: US 9,423,997 B2
(45) Date of Patent: Aug. 23, 2016

(54) ELECTRONIC DEVICE AND METHOD FOR ANALYZING AND PLAYING SOUND SIGNAL

(71) Applicant: HTC Corporation, Taoyuan County (TW)

(72) Inventors: Hann-Shi Tong, Taoyuan County (TW); Chun-Ren Hu, Taoyuan County (TW); You-Yu Lin, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/552,483

(22) Filed: Nov. 25, 2014

(65) Prior Publication Data

US 2016/0147500 A1    May 26, 2016

(51) Int. Cl.
| | | |
|---|---|---|
| *H03G 9/00* | (2006.01) | |
| *G06F 3/16* | (2006.01) | |
| *G10L 21/007* | (2013.01) | |
| *G11B 20/10* | (2006.01) | |
| *H03G 3/32* | (2006.01) | |

(52) U.S. Cl.
CPC ............ *G06F 3/165* (2013.01); *G10L 21/007* (2013.01); *G11B 20/10527* (2013.01); *H03G 3/32* (2013.01); *G11B 2020/10564* (2013.01); *G11B 2020/10574* (2013.01)

(58) Field of Classification Search
CPC ............ H04R 25/558; H04R 1/1083; H04R 2499/11; H04R 1/403; H04R 5/033; H04R 2400/00; H04R 2499/13; H04R 29/006
USPC ......... 381/119, 309, 315, 102, 107, 150, 162, 381/182, 300, 303, 312, 313, 314, 317, 322, 381/34, 372, 386, 394, 56, 66, 71.1, 94.5, 381/98
See application file for complete search history.

(56) References Cited

U.S. PATENT DOCUMENTS

| 5,666,426 | A | 9/1997 | Helms | |
|---|---|---|---|---|
| 7,848,531 | B1 | 12/2010 | Vickers et al. | |
| 7,968,786 | B2 * | 6/2011 | Kemmochi | H03G 3/32 84/621 |
| 2003/0028273 | A1 * | 2/2003 | Lydecker | G10H 1/0091 700/94 |

(Continued)

FOREIGN PATENT DOCUMENTS

| TW | 201126517 | 8/2011 |
|---|---|---|
| TW | I406553 | 8/2013 |

OTHER PUBLICATIONS

Walsh Martin et al.,"Adaptive Dynamics Enhancement", Audio Engineering Society Convention Paper 8343, May 13-16, 2011, pp. 1-10.

(Continued)

*Primary Examiner* — Akelaw Teshale
(74) *Attorney, Agent, or Firm* — Jianq Chyun IP Office

(57) ABSTRACT

An electronic device and a corresponding method for analyzing and playing sound signals are provided. The electronic device includes a microphone, a processor, and a speaker. The microphone receives a sound and generates a sound signal according to the sound. The processor is coupled to the microphone for analyzing the sound signal to obtain an analysis parameter, determining a dynamic range parameter according to the analysis parameter, and adjusting the sound signal according to the dynamic range parameter. The speaker is coupled to the processor for playing the adjusted sound signal.

11 Claims, 3 Drawing Sheets

(56) References Cited

U.S. PATENT DOCUMENTS

| | | |
|---|---|---|
| 2007/0110260 A1 | 5/2007 | Hsieh et al. |
| 2010/0185308 A1* | 7/2010 | Yoshida .................... H04S 7/00 700/94 |
| 2012/0033835 A1 | 2/2012 | Gough et al. |
| 2012/0177228 A1 | 7/2012 | Nathan et al. |

OTHER PUBLICATIONS

"Office Action of Europe Counterpart Application", issued on Apr. 22, 2016, p. 1-p. 9.

"Office Action of Taiwan Counterpart Application", issued on Jun. 2, 2016, p. 1-p. 4.

\* cited by examiner

US 9,423,997 B2

ELECTRONIC DEVICE AND METHOD FOR ANALYZING AND PLAYING SOUND SIGNAL

FIELD OF THE INVENTION

The invention relates to an electronic device and a method for processing sound signal, and more particularly, relates to an electronic device and a method for analyzing and playing sound signal.

DESCRIPTION OF RELATED ART

In present days, many of electronic devices (e.g., a smart phone) include functions of recording and playing sound. The function of recording sound may take place in various different scenarios such as in a meeting room, an outdoor activity, a concert and the like. Among said scenarios, sound pressure levels of sounds being recorded may be very different from one another.

During playback of the sounds previously recorded, the existing electronic device usually uses the same tuning parameter (e.g., the same gain value) to play the sounds recorded from various scenarios. If the same gain value is used to amplify the sounds recorded from different scenarios during playback, a sound quality of the sound heard by users may be influenced due to certain sounds being too low while the other sounds being too loud.

SUMMARY OF THE INVENTION

The invention is directed to an electronic device and a method for analyzing and playing sound signal, which are capable of solving aforesaid sound quality issue caused by using the same parameter.

The electronic device of the invention includes a microphone, a processor, and a speaker. The microphone receives a sound and generates a sound signal according to the sound. The processor is coupled to the microphone for analyzing the sound signal to obtain an analysis parameter, determining a dynamic range parameter according to the analysis parameter, and adjusting the sound signal according to the dynamic range parameter. The speaker is coupled to the processor for playing the adjusted sound signal.

The method for analyzing and playing sound signal of the invention includes: receiving a sound and generating a sound signal according to the sound; analyzing the sound signal to obtain an analysis parameter; determining a dynamic range parameter according to the analysis parameter; adjusting the sound signal according to the dynamic range parameter; and playing the adjusted sound signal.

Based on the above, the electronic device and the method for analyzing and playing sound signal of the invention are capable of setting the dynamic range parameter for playing the sound signal according to the parameters obtained from analyzing the sound signal. Accordingly, the most appropriate dynamic range parameter may be automatically selected for improving the sound quality during playback of the sound signal.

To make the above features and advantages of the disclosure more comprehensible, several embodiments accompanied with drawings are described in detail as follows.

DESCRIPTION OF EMBODIMENTS

Figure 1:
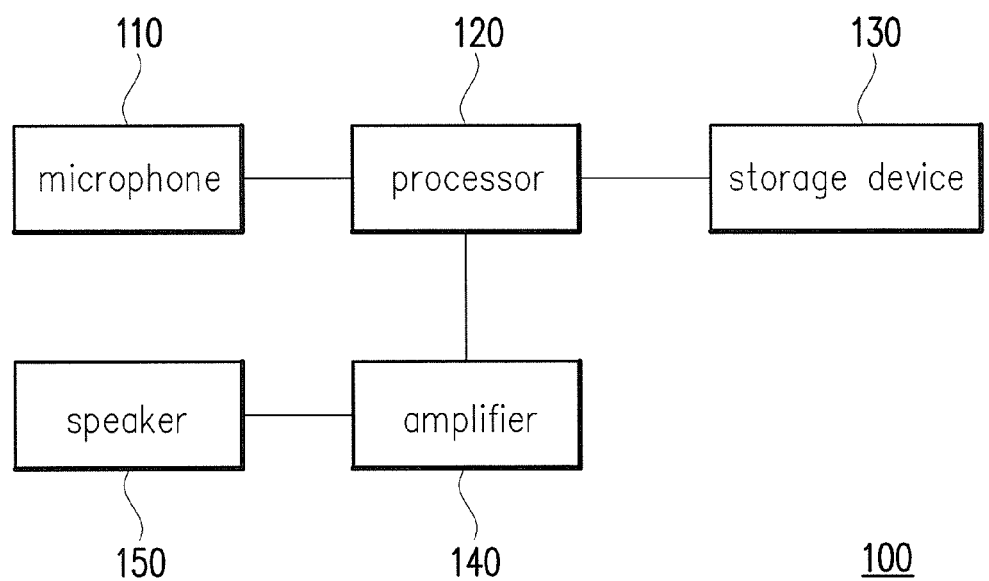
FIG. 1 is a schematic view of an electronic device according to an embodiment of the invention.

FIG. 1 is a schematic view of an electronic device 100 according to an embodiment of the invention. The electronic device 100 may be any electronic devices having functions of recording and playing sound, such as a smart phone, a personal digital assistant (PDA), a tablet computer, a notebook computer, or a desktop computer. The electronic device 100 includes a microphone 110, a processor 120, a storage device 130, an amplifier 140 and a speaker 150. The processor 120 is coupled to the microphone 110, the storage device 130 and the amplifier 140. The amplifier 140 is coupled between the processor 120 and the speaker 150. The storage device 130 may be a volatile memory, a non-volatile memory or a hard disk. In this embodiment, the microphone 110 generally refers to any electronic components capable of receiving an external sound in order to generate a sound signal, and the speaker 150 generally refers to any electronic components capable of playing the sound signal in order to sound.

Figure 2:
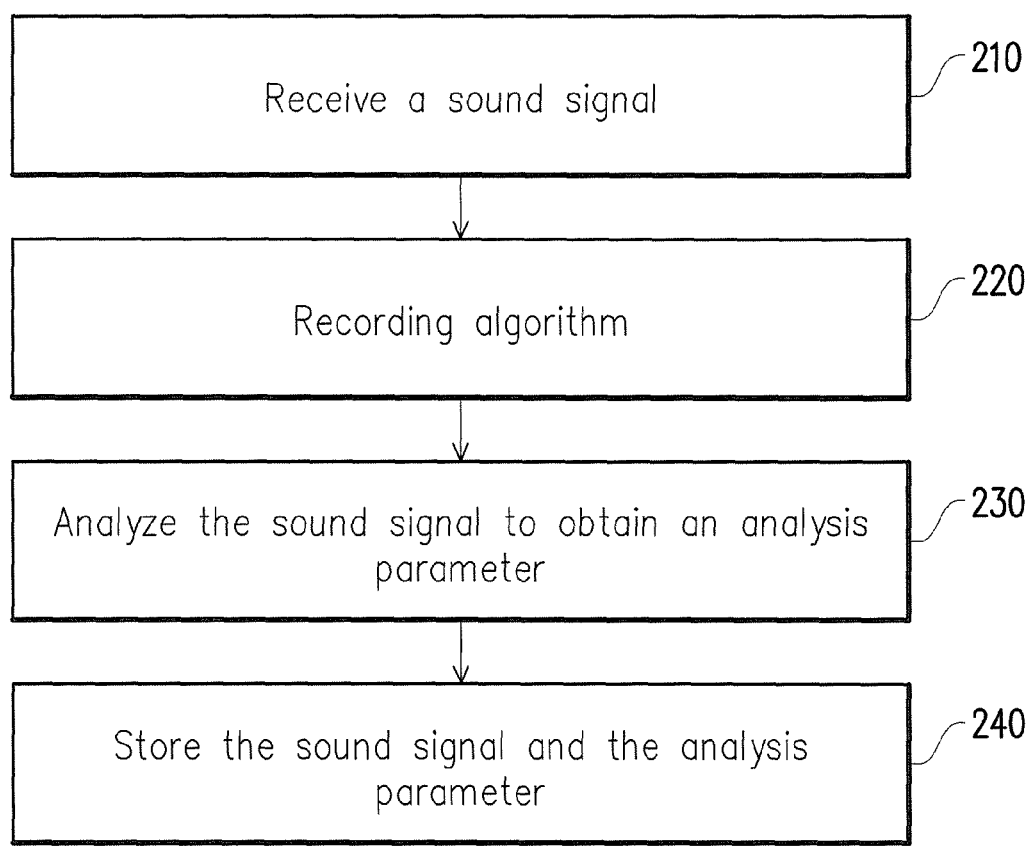
FIG. 2 and FIG. 3 are flowcharts of a method for analyzing and playing sound signal according to an embodiment of the invention.

FIG. 2 is a flowchart of a method for analyzing and playing sound signal according to an embodiment of the invention, and this flow may be executed by the electronic device 100 for recording the sound signal. In step 210, the microphone 110 receives a sound from the outside and generates a sound signal according to the sound. In step 220, the processor 120 executes a recording algorithm. The recording algorithm may include a cancellation for noises in the sound signal and an equalization for the sound signal. Aforesaid equalization is used to adjust a sound pressure level of the sound signal at different frequency bands in order to optimize a playback effect for the sound signal.

In step 230, the processor 120 analyzes the sound signal to obtain an analysis parameter of the sound signal. Overall, the analysis parameter indicates a histogram of the sound signal in a time domain and/or in a frequency domain. The analysis parameter may include one or more parameters. For example, the analysis parameter may include a histogram of the sound pressure level (SPL) of the sound signal. The analysis parameter may also include a mean and a variance of the sound pressure level of the sound signal. The analysis parameter may also include a histogram of the sound signal in a frequency domain.

In step 240, the processor 120 stores the sound signal and the analysis parameter thereof into the storage device 130. For example, the processor 120 may encode the sound signal and the analysis parameter into the same file or two different files to be stored into the storage device 130. If the sound signal and the analysis parameter are stored into the same file, the analysis parameter may be stored into a header of said file.

Figure 3:
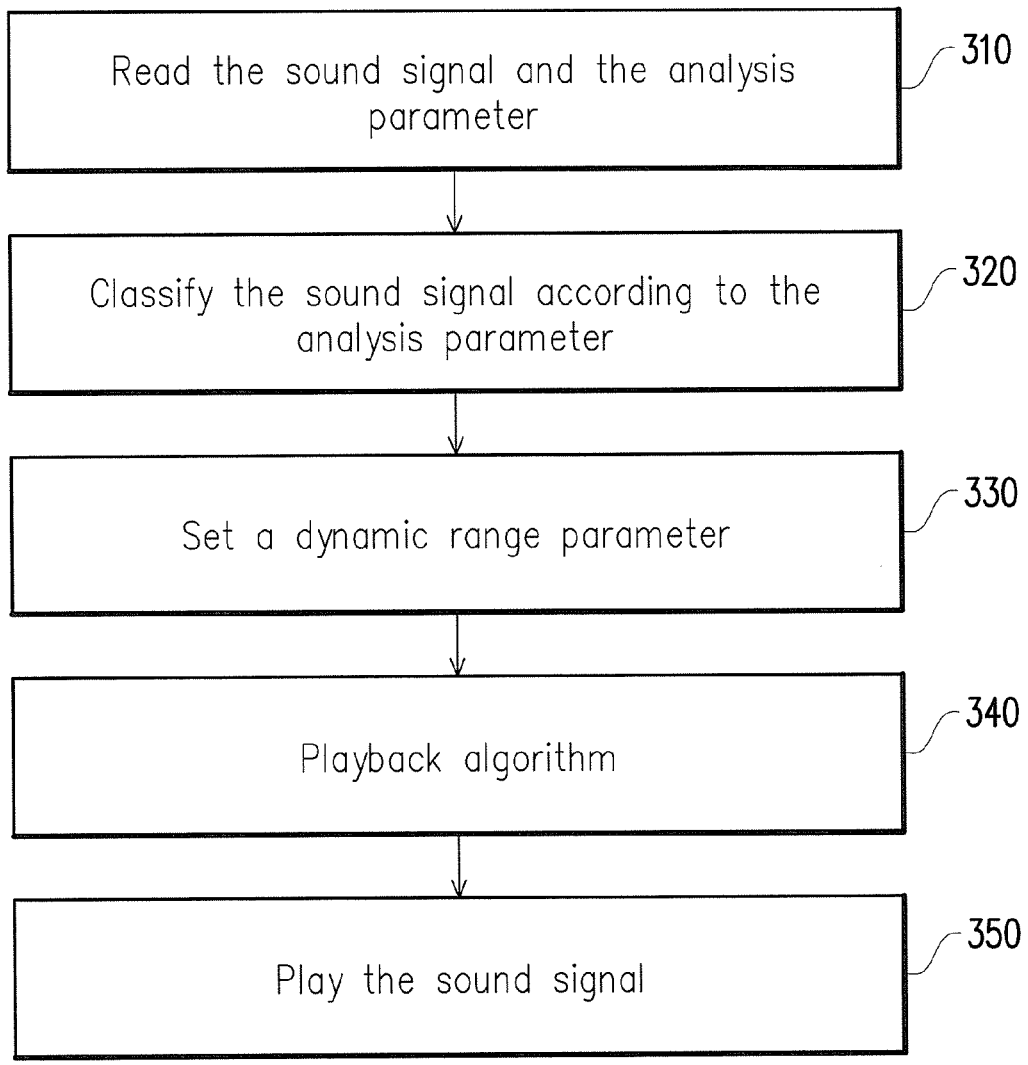

FIG. 3 is another flowchart of aforesaid method for analyzing and playing sound signal, and this flow may be executed by the electronic device 100 for playing the sound signal stored in the storage device 130. In step 310, the processor 120 reads the previously recorded sound signal and the analysis parameter thereof from the storage device 130. In step 320, the processor 120 classifies the sound signal into one of a plurality of types according to the analysis parameter. Each of the types may correspond to one recording scenario. Table 1 below is an example for the types.

TABLE 1

| Types | Scenario | Sound pressure level |
| --- | --- | --- |
| 1 | Meeting | 60 dB SPL |
| 2 | Outdoor | 80 dB SPL |
| 3 | Party | 100 dB SPL |
| 4 | Concert | 110 dB SPL |

In the example of Table 1, the analysis parameter is the mean of the sound pressure level (SPL) of the sound signal, and the sound signal may be classified into one of four types in which each of the types is corresponding to one recording scenario and indicating which kind of scenarios was the sound signal recorded. Each type may correspond to one or more dynamic range parameters. After the sound signal is classified by the processor 120 according to the analysis parameter, in step 330, the processor 120 sets the dynamic range parameter corresponding to the type to which the sound signal belongs to be the dynamic range parameter for playing the sound signal. Each dynamic range parameter corresponding to the type is predetermined in advance, so that users may receive the optimal playback effect during playback of the sound signal of the type. Therefore, steps 320 and 330 are capable of determining the optimal dynamic range parameter according to the analysis parameter of the sound signal.

In step 340, the processor 120 executes a playback algorithm by using the set dynamic range parameter, and the playback algorithm is used to adjust the sound signal according to the set dynamic range parameter.

Each dynamic range parameter of the corresponding type may include one or more parameters. For example, the dynamic range parameter may include a gain value $G_0$. In step 340, the processor 120 may use the gain value $G_0$ to amplify the sound signal.

The dynamic range parameter may also include one or more control parameters. In step 340, the processor 120 may control a dynamic range of the sound signal according to the control parameter.

The sound signal may include a plurality of frequency bands. The dynamic range parameter may also include a plurality of gain values $G_1$ to $G_N$ corresponding to the frequency bands, wherein N is a number of the frequency bands of the sound signal. In step 340, the processor 120 may use the gain values $G_1$ to $G_N$ to perform an equalization for the sound signal. In other words, for each of the frequency bands, the processor 120 may use the gain value corresponding to the frequency band to amplify the frequency band.

Table 2 below is an example for the dynamic range parameters.

TABLE 2

| Dynamic range parameter | Type 1 (Concert) | Type 2 (Meeting) |
| --- | --- | --- |
| Gain value $G_0$ | Smaller | Greater |
| Control parameter | Decreasing | Increasing |
| Gain values $G_1$ to $G_N$ | Optimizing bass and treble | Enhancing voice band |

In the example of Table 2, the sound signal is classified into one of two types including Type 1 corresponding to the recording scenario of Concert, and Type 2 corresponding to the recording scenario of Meeting. The dynamic range parameters corresponding to the two types both include the gain value $G_0$, the control parameter, and the gain values $G_1$ to $G_N$. If the sound signal is classified as Type 1, the corresponding gain value $G_0$ is smaller because the sound pressure level of the concert is already large enough without needing much gain. The control parameter corresponding to Type 1 decreases the dynamic range of the sound signal. The gain values $G_1$ to $G_N$ optimize a bass band and a treble band. If the sound signal is classified as Type 2, the corresponding gain value $G_0$ is greater because the sound pressure level of the human voice is usually not loud enough and requires to be amplified for playing. The control parameter corresponding to Type 2 increases the dynamic range of the sound signal. The gain values $G_1$ to $G_N$ enhance a voice band of the sound signal.

Next, in step 350, the amplifier 140 amplifies the sound signal processed by the playback algorithm, and then the speaker 150 plays the sound signal to generate a sound that can be heard by users.

In summary, the invention is capable of classifying the sound signal according to an analyzed result of the sound signal and selecting the most appropriate dynamic range parameter for the sound signal in order to improve the sound quality when playing the sound signal.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. An electronic device, comprising:
   a microphone, receiving a sound and generating a sound signal according to the sound;
   a processor, coupled to the microphone, analyzing the sound signal to obtain an analysis parameter, looking up a previously recorded lookup table recording a plurality of types of recording scenarios and an analysis parameter and at least a dynamic range parameter corresponding to each recording scenario by using the obtained analysis parameter to classify the sound signal into one of the plurality of types of recording scenarios and determine the dynamic range parameter corresponding to the type, and adjusting the sound signal according to the dynamic range parameter, wherein the analysis parameter is a histogram of a sound pressure level of the sound signal or a mean and a variance of the sound pressure level of the sound signal; and
   a speaker, coupled to the processor, playing the adjusted sound signal.

2. The electronic device according to claim 1, wherein the dynamic range parameter comprises a gain value, and the processor uses the gain value to amplify the sound signal.

3. The electronic device according to claim 1, wherein the dynamic range parameter comprises a control parameter, and the processor controls a dynamic range of the sound signal according to the control parameter.

4. The electronic device according to claim 1, wherein the sound signal comprises a plurality of frequency bands, the dynamic range parameter comprises a plurality of gain values corresponding to the frequency bands, and for each of the frequency bands the processor uses the corresponding gain value to amplify the frequency band.

5. The electronic device according to claim 1, further comprising:
   a storage device, coupled to the processor, storing the sound signal and the analysis parameter; and
   an amplifier, coupled between the processor and the speaker, amplifying the adjusted sound signal before the sound signal is played by the speaker.

6. The electronic device according to claim 5, wherein the processor stores the sound signal into a file stored in the storage device, and stores the analysis parameter into a header of the file.

7. A method for analyzing and playing sound signal, comprising:
   receiving, by a processor, a sound and generating a sound signal according to the sound; analyzing the sound signal to obtain an analysis parameter, wherein the analysis parameter is a histogram of a sound pressure level of the sound signal or a mean and a variance of the sound pressure level of the sound signal;
   looking up, by the processor, a previously recorded lookup table recording a plurality of types of recording scenarios and an analysis parameter and at least a dynamic range parameter corresponding to each recording scenario by using the obtained analysis parameter to classify the sound signal into one of the plurality of types of recording scenarios and determine the dynamic range parameter corresponding to the type;
   adjusting, by the processor, the sound signal according to the dynamic range parameter; mad playing the adjusted sound signal.

8. The method for analyzing and playing sound signal according to claim 7, wherein the dynamic range parameter comprises a gain value, and the method for analyzing and playing sound signal further comprises:
   using the gain value to amplify the sound signal.

9. The method for analyzing and playing sound signal according to claim 7, wherein the dynamic range parameter comprises a control parameter, and the method for analyzing and playing sound signal further comprises:
   controlling a dynamic range of the sound signal according to the control parameter.

10. The method for analyzing and playing sound signal according to claim 7, wherein the sound signal comprises a plurality of frequency bands, the dynamic range parameter comprises a plurality of gain values corresponding to the frequency bands, and the method for analyzing and playing sound signal further comprises:
    for each of the frequency bands, using the corresponding gain value to amplify the frequency band.

11. The method for analyzing and playing sound signal according to claim 7, further comprising:
    storing the sound signal into a file; and
    storing the analysis parameter into a header of the file.

* * * * *